United States Patent
Olin et al.

(10) Patent No.: US 6,924,489 B2
(45) Date of Patent: Aug. 2, 2005

(54) DEVICE FOR REDUCING THE IMPACT OF DISTORTIONS IN A MICROSCOPE

(75) Inventors: Håkan Olin, Gothenburg (SE); Drister Svensson, Gothenburg (SE); Fredrik Althoff, Mölnlycke (SE); Andrey Danilov, Gothenburg (SE); Paul Bengtsson, Gothenburg (SE); Martin Hospers, Gothenburg (SE)

(73) Assignee: Nanofactory Instruments AB, Gothenburg (SE)

( * ) Notice: Subject to any disclaimer, the term of this patent is extended or adjusted under 35 U.S.C. 154(b) by 0 days.

(21) Appl. No.: 10/756,726

(22) Filed: Jan. 13, 2004

(65) Prior Publication Data

US 2004/0195523 A1 Oct. 7, 2004

Related U.S. Application Data

(63) Continuation of application No. PCT/SE02/01385, filed on Jul. 12, 2002.

(30) Foreign Application Priority Data

Jul. 13, 2001 (SE) .............................................. 0102498
Nov. 12, 2001 (SE) .............................................. 0103779
Nov. 12, 2001 (SE) .............................................. 0103782

(51) Int. Cl.[7] ............................................. H01J 37/26
(52) U.S. Cl. ................ 250/442.11; 250/307; 250/492.2; 378/34; 378/35
(58) Field of Search ........................... 250/442.11, 307, 250/492.2; 378/34, 35

(56) References Cited

U.S. PATENT DOCUMENTS 5,107,113 A * 4/1992 Robinson ..................... 250/306
5,214,282 A * 5/1993 Yamaguchi et al. ......... 250/306
6,417,512 B1 * 7/2002 Suzuki ........................ 250/307

FOREIGN PATENT DOCUMENTS

| JP | 63202834 | 8/1988 |
| JP | 2024951 | 1/1990 |
| JP | 8273570 | 10/1996 |
| JP | 10302697 | 11/1998 |

* cited by examiner

Primary Examiner—John R. Lee
Assistant Examiner—Zia R. Hashmi
(74) Attorney, Agent, or Firm—Gauthier & Connors

(57) ABSTRACT

This invention relates to a device for reducing the impact of undesired distortions when studying a sample in an electron microscope, wherein said sample is arranged to be mounted on a micro-positioning device, characterised in that said micro-positioning device is connected with a control device, being arranged to control said micro-positioning device so as to compensate for measurement errors due to undesired distortions.

11 Claims, 1 Drawing Sheet

DEVICE FOR REDUCING THE IMPACT OF DISTORTIONS IN A MICROSCOPE

This application is a continuation of PCT/SE02/01385 filed Jul. 12, 2002.

TECHNICAL FIELD OF THE INVENTION

This invention relates to a device and methods for reducing the impact of undesired distortions when studying a sample in an electron microscope, wherein said sample is arranged to be mounted on a micro-positioning device.

BACKGROUND OF THE INVENTION

As the nanotechnology field has developed, the demands on the improved measuring capabilities has increased, and during the last years, microscopy devices having more or less atomic resolution has been developed, and the demands for such microscopes is continuously growing. For this purpose, electron microscopy devices, such as scanning electron microscopes (SEM) and transmission electron microscopes (TEM) have been developed, and those electron microscopes partly fulfil the above demands. Further, different scanning probe technologies, such as scanning tunnelling microscopy and atomic force microscopy also fulfil some of the above demands.

Basically, in an electron microscope, electrons are used for imaging, instead of light particles which is the case in many prior devices. Since electrons have a smaller wavelength than light, an electron microscope can resolve much smaller particles than a microscope based on light transmission. However, since the magnification and resolution is high in electron microscopes, they are also more susceptible to vibration, drift (such as thermal drift) and other distortions. Due to this, electron microscopes are built in a way in which they are very stable, and they are commonly situated in special vibration damped rooms. Unfortunately, this makes electron microscope installations very expensive and high demands need to be met by the location of such a microscope. This also result in restrictions on which kind of experiments that may be made and what kind of samples that may be used in the microscope.

SUMMARY OF THE INVENTION

An object of this invention is hence to provide a device for use with an electron microscope, for reducing the impact of undesired distortions, and hence overcoming at least some of the disadvantages of the prior art, stated above.

This and other objects of the invention is achieved by a device by way of introduction, characterised in that said micro-positioning device is connected with a control device, being arranged to control said micro-positioning device so as to compensate for measurement errors due to undesired distortions. By arranging such a control device in connection with a micro-positioning device, the micro-positioning device may be used to actively reduce the impact of for example vibrations or drift, and hence a larger extent of distortions may be accepted, since they may be actively compensated for. This reduces the demands on the microscopy stability and/or localisation and increases the area of use for the microscopy device.

According to a preferred embodiment of this invention, the device further comprises a measuring device for measuring said unwanted distortion, acting on said sample, and a feedback means for feeding information from said measuring device back to said control means for controlling the same in accordance therewith. Suitably, said control device is arranged to control the actuation movement of said micro-positioning device and hence control the position of the sample, in order to counteract sample movements caused by said unwanted distortion. Consequently, it is possible to essentially keep the sample at a constant position, independent on any vibrations or movements of the microscopy as such. Preferably, said measuring device comprises a device for measuring vibrations, such as an accelerometer, being positioned either in proximity with said sample, or alternatively on the electron microscope itself.

Suitably, said measuring device comprises an image analysis system, being arranged to analyse images from the imaging system of said microscope, and in that way measure the impact of said undesired distortions on said sample. By using the microscopy image, or parts of an image, only such movements actually affecting the sample will be taken account for, resulting in an accurate compensation. Moreover, this method utilises information already available in the microscope, without any additional alterations being necessary.

According to an alternative embodiment of this invention, said micropositioning device is arranged to be controlled by an excitation signal having a fixed frequency. By exciting the sample in this way, and analysing the movement of the sample during a plurality of frequency cycles, the signal will overlap for each cycle, while any distortions will be damped. This construction is essentially founded on so called lock-in techniques. Preferably, said sample is arranged to be imaged by said microscope, the device further comprising an image signal analysing system, for analysing image signals from said microscope during a plurality of excitation signal cycles. In the same way as above this method utilises information already available in the microscope, without any additional alterations being necessary.

Suitably, said unwanted distortions is one of mechanical vibrations or drift, temperature drift or acoustic distortions, and the result is better resolution of the electron microscope. Said electron microscope preferably further comprises a scanning probe device, such as a STM or AFM, said micro-positioning device being incorporated in said scanning probe device, providing a compact solution. Moreover, said micropositioning device comprises one of a piezoelectric element, an inertia controlled device or a microelectromechanical system (MEMS) structure for micropositioning of said sample.

The above and other objects are also achieved by a method for reducing the impact of undesired distortions in a microscope, comprising the following steps; arranging a sample to be studied on a micropositioning means, measuring the movements of the sample, caused by said undesired distortion, and controlling said micropositioning means, based on the sample movement measurements, as to counteract the sample movement due to distortion.

Alternatively, the above and other objects are also achieved by a method for reducing the impact of undesired distortions in a microscope, comprising the following steps; arranging a sample to be studied on a micropositioning means; feeding an excitation signal, having a locked frequency, to said micropositioning means; imaging said sample by means of said microscope; and analysing the images from said microscope during a plurality of excitation signal.

BRIEF DESCRIPTION OF THE DRAWINGS

This invention will hereinafter be described in closer detail by means of preferred embodiments thereof, with reference to the accompanying drawings.

DESCRIPTION OF PREFERRED EMBODIMENTS OF THE INVENTION

Figure 1:
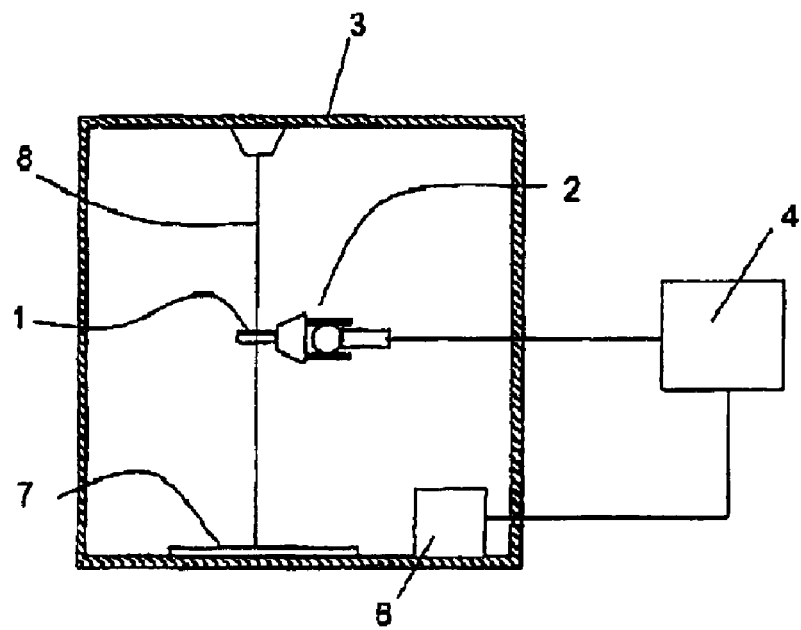
FIG. 1 discloses a schematic drawing of a microscopy device with a device for reducing distortions in accordance with a first embodiment of this invention.

A first embodiment of this invention will hereinafter be described with reference to FIG. 1. This embodiment is primarily designed to compensate for vibrations in the system, for example due to external disturbances. As is stated above, the standard solution for this problem has been to build a stable microscope and place it in a low-vibration environment. The problem with vibrations is that the microscopy images becomes fuzzy, especially images with high resolution, such as atomic resolution. However, in accordance with a first embodiment of this invention, a sample 1 to be analysed by the microscope 3 is positioned on an actuator or micropositioning device 3, being connected with a control device 4, for controlling the movement of the micropositioning device. Such actuators are previously known for positioning a sample in a correct way, for example in relation to a measurement tip. Moreover, a measuring device 6 for measuring the vibrations is arranged in the microscope, in order to get a measure of the vibrations that is to be compensated for. This measurement device 6 may for example comprise an accelerometer, positioned close to the sample, or on a part of the electron microscope 3. One way is to put the accelerometer in direct mechanical contact with the part, on which vibrations is to be measured. Hence, if the electron microscope 3 is exposed to vibrations, they will be registered by said accelerometer 6 (or the like). The signal from said measurement device 6 is thereafter arranged to be fed to the control device 4 for said micropositioning device 2, whereafter the micropositioning device 2 is controlled to move the sample 1 in order to counteract the measured vibrations. Hence, the sample 1 will essentially be held still during vibrations, and hence any distortions of the measurement will be avoided.

Figure 2:
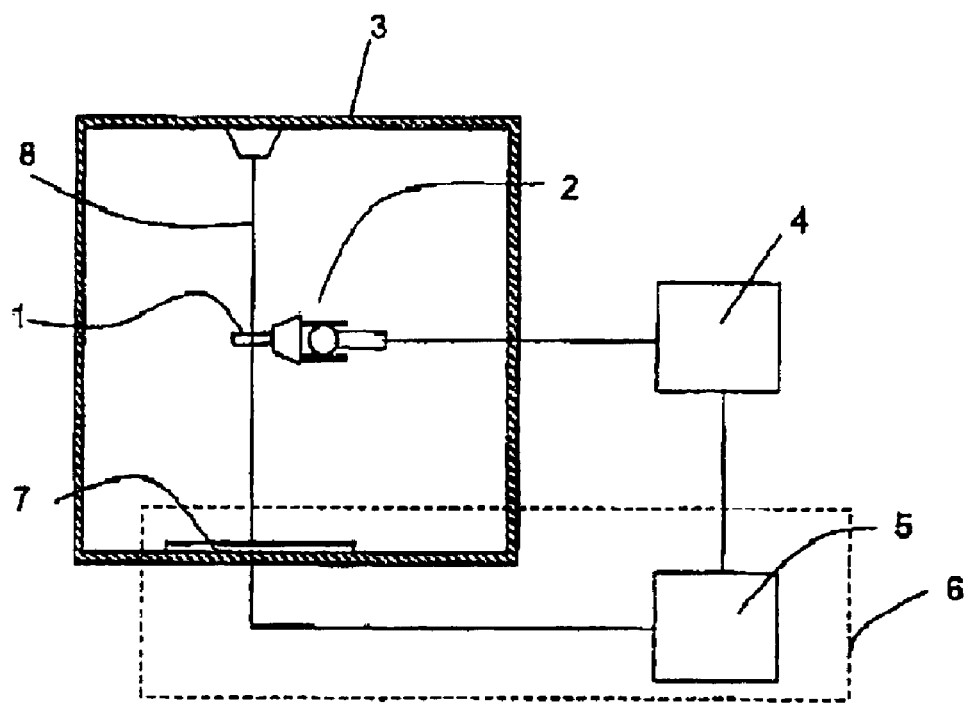
FIG. 2 discloses a schematic drawing of a microscopy device with a device for reducing distortions in accordance with an alternative embodiment of this invention.

Alternatively, as is schematically disclosed in FIG. 2, the microscope image 7 itself may be used for analysing the vibrations and hence an image processing means 5, 7 may constitute said measurement device 6.

Image analysis is made on the image that is imaged by said microscope, and the analysis may be made on the entire image or on parts thereof. For example, structures of the sample may be identified by means of image analysis. A feed back system, connected with the micropositioning control device, may then be used to compensate for the vibrations by regulating the position of the sample 1, so that its position in relation to the electron beam 8 remains unchanged. One way of performing the above image analysis is to sample the electron microscope image through a CCD camera, and measure the signal by an imaging system in a computer or DSP processor. The imaging system may for example comprise a framegrabber, handling the transfer and some of the analysis of the images. The computer or DSP processor provides the final analysis for determining the vibration of affecting the measurement system.

Furthermore, the above described actuator, or micropositioning device 2, may for example be constituted by a piezoelectric device, such as an inertia micropositioning device, as disclosed in any one of the patent documents WO 00/77553 or WO 02/46821, both assigned to the applicant behind the present invention, and both documents incorporated herein by reference. Such a micropositioning device 2 may not only be use for counteracting vibrations, but may simultaneously be used for aligning the microscopy device, and such aligning may be made in-situ, dynamically during a measurement process. Such a micropositioning device may constitute a part of a scanning tunnelling microscope or an atomic force microscope, being incorporated in the electron microscope. The control signals for micropositioning of the sample in relation to the electron beam and vibration counter-acting may easily be superimposed, to generate a desired movement pattern for the sample.

The embodiments shown in FIGS. 1 and 2 may also essentially be used to compensate for distortions due to drift, such as thermal drift or drift due to mechanical movements. Such drift results in that the sample 1 moves mechanically in relation to the electron beam 8 of the electron microscope 3, often as a function of time. Previously, attempts have been made to compensate for such drift by letting the electron beam move in proportion to this mechanical movement, unfortunately, this results in reduced measurement capabilities of the electron microscope, since the alignment of the electron beam in relation to the electron optics will be affected. It shall be noted than in the below, components having the essentially same features as the corresponding components described above, will not be closer described again.

In accordance with the invention, the above problem may be solved may by using the actuator or micropositioning device 2 to move the sample, in a direction opposite to the problematic drift. Thereby, the electron beam 8 itself need not be moved, whereby the electron beam 8 may be properly aligned with the electron optics at all times, given that it was properly aligned to begin with. In this case, the micropositioning device is used to mechanically move the sample, for example by means of an piezoelectric element that changes its length when an voltage is applied over it, in order to counteract mechanical distortions due to drift. The size of the compensation may either be set manually, by using a drift compensation means, in which expected drift coordinates may be set manually. Alternatively, image analysis feed back may be used to set the size of the compensation movement of the sample. Image analysis is made on the image that is imaged by said microscope, and the analysis may be made on the entire image or on parts thereof. For example, structures of the sample may be identified by means of image analysis. The feed back system, connected with the micropositioning control device 4, may then be programmed to compensate for the drift by regulating the position of the sample 1, so that its position in relation to the electron beam 8 remains unchanged. In that way automatic compensation for drift, such as temperature drift or drift due to mechanical vibrations, may be achieved. However, in the case of compensation for thermal drift it shall be noted that the above described image analysis is the preferred measurement method, since the imaging system, together with an appropriate image analysis system, may be designed to keep track of features in the sample, and measure the movement in time between different frames or time intervals.

A third embodiment of this invention will hereinafter be described with reference to FIG. 2 only. Also in this case, components that have been described above will not be described in further detail below. As described above, in electron microscopes and scanning probe microscopes, mechanical but also acoustical distortions may reduce the resolution of the microscope. However, in accordance with this embodiment, this problem is solved by positioning the sample 1 to be analysed on an actuator means 2, being arranged to be controlled by a control device 4. Thereafter, the sample is excited at a fixed or locked frequency f by said actuator means 2, being controlled by the control device 4. The actuator may for example comprise a piezoelectric element or an electrostatically excitable microelectromechanical system (MEMS). During said excitation, the sample is imaged on an image plane 7 in the microscope 3, and the images is processed by a computer means or processor 5 during a chosen integration time, covering a plurality of frequency cycles for said frequency-locked excitation. By exciting a process with a known frequency, using a phase controlled signal, data from the process may be determined with a very high signal-to-noise ratio, and the influence of any distortions, having an irregular behaviour, is reduced. This may be done by multiplying the measured signal from the imaging processing with the excitation signal, and filter away all other frequencies. Theoretically, the signal-to-noise ratio may be improved with a factor $\sqrt{n}$, where n is the number of cycles included in said integration.

It shall be noted that many further developments of this invention is possible for a man skilled in the art, without departing from the scope of this invention, as defined by the appended claims.

Especially, it shall be noted that the above described micropositioning device is not limited to be a piezoelectric or MEMS structure, but in fact many other transducers, such as magnetoelastic or bimorph transducers, or motors with gear boxes may be used in order to realise said micropositioning device. It shall also be noted that this invention is not limited to compensation of for example drift in one direction, but may be used to compensate drift in all dimensions in which micropositioning by said micropositioning device is possible.

It shall also be noted that the present invention may be incorporated in existing microscopy devices. Moreover, the invention may be implemented in commercially available combination microscopes, such as TEM-STM or TEM-AFM. In those cases, the sample is controlled by one micropositioning device, and the STM or AFM probe is controlled by a second micropositioning device. Moreover, it shall be noted that the present invention is applicable to other kinds of electron microscopes, not only SEM and TEM mentioned above.

Finally, it shall be noted that by using this invention, it is possible to reduce the cost for installation of the electron microscope or alternatively increase the stability with an existing installation, resulting in an increased resolution.

What is claimed is:

1. A device for reducing the impact of undesired distortions when studying a sample in an transmission electron microscope (TEM), wherein said sample is arranged to be mounted on a micro-positioning device arranged in the path of the electron beam, said micro-positioning device being capable of adjusting the position of said sample, wherein said micro-positioning device is connected to a control device arranged to control the position of the sample, in order to compensate for measurement errors due to undesired distortions.

2. A device according to claim 1, said device further comprising a measuring device for measuring said undesired distortions acting on said sample, and a feedback for feeding information from said measuring device back to said control means for allowing counteraction of sample movements caused by said undesired distortions.

3. A device according to claim 2, wherein said measuring device comprises a device for measuring vibrations, such as an accelerometer, being positioned either in proximity with said sample, or alternatively on the electron microscope itself.

4. A device according to claim 2, wherein said measuring device comprises an image analysis system, being arranged to analyze images from the imaging system of said microscope, and in that way measure the impact of said undesired distortions on said sample.

5. A device according to claim 1, wherein said micropositioning device is arranged to be controlled by a periodic excitation signal having a fixed frequency.

6. A device according to claim 5, wherein said sample is arranged to be imaged by said microscope, the device further comprising an image signal analyzing system, for analyzing image signals from said microscope during a plurality of excitation signal cycles.

7. A device according to claim 1, wherein said unwanted distortions is one of mechanical vibrations or drift, temperature drift or acoustic distortions.

8. A device according to claim 1, wherein said electron microscope further comprises a scanning probe device, such as a STM or AFM, said micro-positioning device being incorporated in said scanning probe device.

9. A device according to claim 1, wherein said micropositioning device comprises one of a piezoelectric element, an inertia controlled device or a micro-electromechanical system (MEMS) structure for micropositioning of said sample.

10. A method for reducing the impact of undesired distortions in a transmission electron microscope (TEM), comprising the following steps:

arranging a micro-positioning device in an opening on the side of the microscope, arranging a sample to be studied on the micro-positioning device, measuring the movements of the sample, caused by said undesired distortions, and controlling said micro-positioning device, based on the sample movement measurements, as to counteract the sample movement due to distortion.

11. A method for reducing the impact of undesired distortions in a microscope, comprising the following steps:

arranging a sample to be studied on a micropositioning device, feeding a periodic excitation signal with a locked frequency to said micropositioning device, imaging said sample by means of said microscope, and analyzing the images from said microscope during a plurality of excitation signal, in order to reduce the influence of any distortions.

* * * * *